(12) United States Patent  (10) Patent No.: US 8,715,517 B2
Imbert et al.  (45) Date of Patent: May 6, 2014

(54) PROCESS FOR FABRICATING AN ACOUSTIC WAVE RESONATOR COMPRISING A SUSPENDED MEMBRANE

(75) Inventors: Bruno Imbert, Grenoble (FR); Emmanuel Defay, Voreppe (FR); Chrystel Deguet, Saint Ismier (FR); Hubert Moriceau, Saint Egreve (FR); Mathieu Pijolat, Sorbiers (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 72 days.

(21) Appl. No.: 13/314,844

(22) Filed: Dec. 8, 2011

(65) Prior Publication Data

US 2012/0145667 A1  Jun. 14, 2012

(30) Foreign Application Priority Data

Dec. 10, 2010  (FR) ..................... 10 60358

(51) Int. Cl.
H03H 3/08  (2006.01)
H03H 3/00  (2006.01)
B32B 37/30  (2006.01)

(52) U.S. Cl.
CPC . H03H 3/08 (2013.01); H03H 3/00 (2013.01); B32B 37/30 (2013.01)
USPC .......................................................... 216/34

(58) Field of Classification Search
None
See application file for complete search history.

(56) References Cited

U.S. PATENT DOCUMENTS

| 5,234,562 | A  | * | 8/1993  | Uenishi et al. ............... 204/199 |
| 5,804,086 | A  |   | 9/1998  | Bruel |
| 6,225,190 | B1 |   | 5/2001  | Bruel et al. |
| 7,940,477 | B2 |   | 5/2011  | Brun et al. |
| 8,004,154 | B2 |   | 8/2011  | Cueff et al. |
| 2003/0088960 | A1 | * | 5/2003 | Seo et al. ..................... 29/25.35 |
| 2003/0199105 | A1 |   | 10/2003 | Kub et al. |
| 2005/0255234 | A1 |   | 11/2005 | Kanda et al. |

(Continued)

FOREIGN PATENT DOCUMENTS

EP  0851465 A1  7/1998
WO  95/20824 A1  8/1995

OTHER PUBLICATIONS

Gachon, E. et al., "Acoustics 2008/1348 High Overtone Bulk Acoustic Resonators Based on Thinned Single-crystal Piezoelectric Layers: Filters and Frequency Sources Applications," European Frequency and Time Forum, one page (2008).

(Continued)

Primary Examiner — Shamim Ahmed
Assistant Examiner — Bradford Gates
(74) Attorney, Agent, or Firm — Baker & Hostetler LLP (57) ABSTRACT

A process for fabricating an acoustic wave resonator comprising a suspended membrane comprising a piezoelectric material layer, comprises the following steps: production of a first stack comprising at least one layer of first piezoelectric material on the surface of a first substrate; production of a second stack comprising at least one second substrate; production of at least one non-bonding initiating zone by deposition or creation of particles of controlled sizes leaving the surface of one of said stacks endowed locally with projecting nanostructures before a subsequent bonding step; direct bonding of said two stacks creating a blister between the stacks, due to the presence of the non-bonding initiating zone; and, thinning of the first stack to eliminate at least the first substrate.

24 Claims, 6 Drawing Sheets

(56) References Cited

U.S. PATENT DOCUMENTS

| | | | |
|---|---|---|---|
| 2007/0194863 A1* | 8/2007 | Shibata et al. | 333/187 |
| 2008/0258829 A1* | 10/2008 | Kubena et al. | 331/158 |
| 2009/0127978 A1* | 5/2009 | Asai et al. | 310/322 |
| 2010/0295635 A1* | 11/2010 | Schubert et al. | 333/235 |
| 2011/0061215 A1 | 3/2011 | Defay et al. | |
| 2011/0132866 A1 | 6/2011 | Pijolat | |
| 2011/0183208 A1* | 7/2011 | Ohtsuka et al. | 429/218.1 |
| 2012/0007666 A1 | 1/2012 | David | |
| 2012/0056299 A1 | 3/2012 | Defay | |

OTHER PUBLICATIONS

Campanella, H. et al., "Analytical and Finite-Element Modeling of a Localized-mass Sensor," IEEE Sensors, pp. 367-370 (2008).

Kaitila, J., Review of Wave Propagation in BAW Thin Film Devices Progress and Prospects, IEEE Ultrasonics Symposium, 120-129 (2007).

Pijolat, M. et al., "Large electromechanical coupling factor film bulk acoustic resonator with X-cut LiNbO3 layer transfer," Appl. Phys. Lett. 95, 182106, pp. 1-3 (2006).

Osugi, Y. et al., "Single crystal FBAR with LiNbO3 and LiTaO3 piezoelectric substance layers," IEEE, pp. 873-876 (2007).

Muralt, P. et al., "Is there a better material for thin film BAW applications than AlN?," IEEE Ultrasonics Symposium, pp. 315-320 (2005).

Tong, Q.-Y. and Gosele, U., Semiconductor Wafer Bonding: Science and Technology, Wiley, New York, pp. 42-47, 31 pages (1999).

Aigner, R., "Bringing BAW Technology into Volume Production: The Ten Commandments and the Seven Deadly Sins," Third International Symposium on Acoustic Wave Devices for Future Mobile Communications Systems (2007).

Steichen, W. and Ballandras, S., "Acousitc components used for filtering: reviews of various technologies," editions de Techniques de l'Ingenieur, E-2000, pp. 1-27 (2007).

Q.Y. Tong, et al., "Semiconductor Wafer Bonding: Recent Developments", Materials Chemistry and Physics, Mar. 1, 1994, pp. 101-127, vol. 37, No. 2, XP024148341.

M. Pijolat, et al., "Large electromechanical coupling factor film bulk acoustic resonator with x-cut LiNb03 layer transfer", Applied Physics Letters, Nov. 5, 2009, pp. 182106-1 thru 182106-3, vol. 95, No. 18, XP012126324.

\* cited by examiner

PROCESS FOR FABRICATING AN ACOUSTIC WAVE RESONATOR COMPRISING A SUSPENDED MEMBRANE

CROSS-REFERENCE TO RELATED APPLICATION

This application claims priority to foreign French patent application No. FR 1060358, filed on Dec. 10, 2010, the disclosure of which is incorporated by reference in its entirety.

FIELD OF THE INVENTION

The field of the invention is that of acoustic wave resonator filters. The expansion in radiofrequency telecommunications over about the last ten years has resulted in crowding of the authorized frequency bands. To profit from the available frequency ranges, systems must include band filtering, with a narrow transition band. Only the filters with resonators employing SAW (surface waves) or BAW (bulk waves) technology, using the piezoelectric properties of materials, make it possible to meet these specifications with low losses and reduced crowding. Today, the piezoelectric layers used for these filters are produced by deposition (BAW "Bulk Acoustic Wave" filters) or on the basis of solid substrates (SAW "Surface Acoustic Wave" filters).

BACKGROUND

Figure 1:
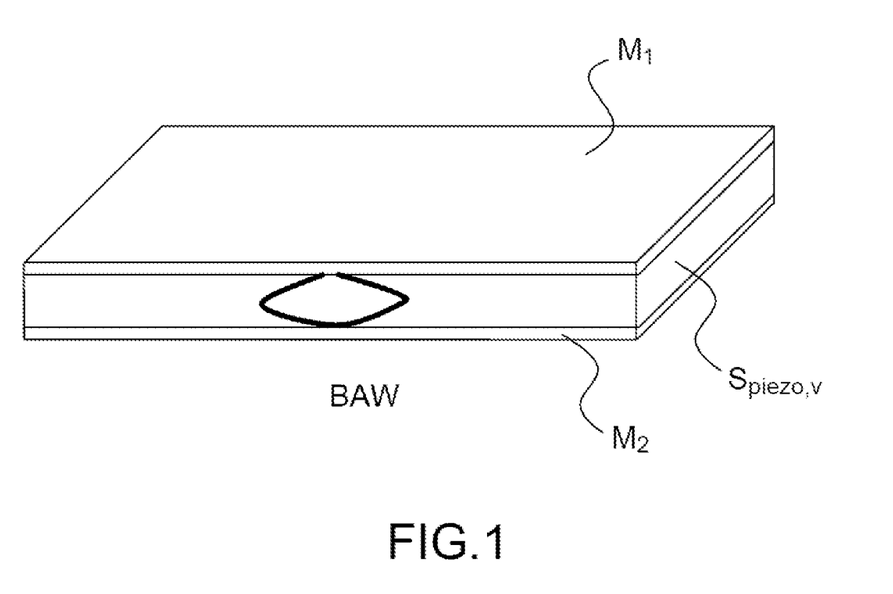
FIG. 1 illustrates the operating principle of the BAW components highlighting the propagation of the bulk acoustic waves.

Generally, the operating principle of BAW components is illustrated in FIG. 1 which shows a bulk wave filter structure: a piezoelectric substrate $S_{piezo, v}$ is inserted between two metallizations $M_1$ and $M_2$ allowing the propagation of bulk waves.

The following articles recount a complete overview of filters based on resonators of BAW and SAW type: W. Steichen, S. Ballandras, "Composants acoustiques utilisés pour le filtrage: revues de différentes technologies" [Acoustic components used for filtering: reviews of various technologies], Editions de Techniques de l'Ingénieur, E-2000, 31 pages, 2008; R. Aigner, Bringing BAW technology into volume production: the Ten Commandments and the seven deadly sins, Proceedings of the third international symposium on acoustic wave devices for future mobile communication systems (2007). J. Kaitila: Review of wave propagation in BAW thin film devices: progress and prospects, Proceedings of the 2007 IEEE Ultrasonics Symposium. P. Muralt et al.: Is there a better material for thin film BAW applications than AlN, Proceedings of the 2005 IEEE Ultrasonics Symposium.

Bulk wave filters have existed for tens of years at frequencies of a few MHz to a few tens of MHz, using mainly impedance elements or structures with lateral coupling on quartz for narrow-band applications, but their implementation at radiofrequencies dates back only about ten years, following Lakin's pioneering work on the use of piezoelectric layers deposited by cathodic sputtering for such purposes. The company Agilent whose "FBAR filter" (Film Bulk Acoustic Resonator) branch has given rise to the spin-off AVAGO, was the first to develop an RF filter based on impedance elements exploiting thin films of aluminum nitride (AlN), deposited polycrystalline material. Following these technical advances, a large number of academic and industrial researchers have eagerly pursued this track, giving rise to sustained inventive activity during the present decade.

Generally, BAW resonators utilize the thickness-wise resonance of a thin piezoelectric layer which is acoustically isolated from the substrate either by a membrane (FBAR technology used by AVAGO Technologies), or by a Bragg grating (SMR technology used by Infineon). At the present time, the material most widely employed with BAW technology is Aluminum Nitride (AlN), which exhibits the advantage of having piezoelectric coupling coefficients of the order of 6.5%, and also of having low acoustic and dielectric losses, thereby allowing the synthesis of filters exhibiting passbands that are compatible with the specifications stipulated by most telecommunication standards localized between 2 and 4 GHz.

Nonetheless, several problems continue to confront the extremely constraining specifications exhibited by a few frequency bands, such as the DCS standard.

Firstly, the piezoelectric coupling coefficients allowed by AlN do not authorize relative passbands of greater than 6%. Such bandwidths already require the use of electrodes exhibiting a very large acoustic impedance (made of Molybdenum or Tungsten), so as to confine the elastic energy in the piezoelectric layer, and of thicknesses carefully determined so as to maximize their influence on the piezoelectric coupling coefficient of the resonators, as described in the following articles: R. Aigner, Bringing BAW technology into volume production: the Ten Commandments and the seven deadly sins, Proceedings of the third international symposium on acoustic wave devices for future mobile communication systems (2007); J. Kaitila, Review of wave propagation in BAW thin film devices: progress and prospects, Proceedings of the 2007 IEEE Ultrasonics Symposium. At the present time, no credible solutions exist for extending this relative band at constant losses.

Research is being conducted to find other materials exhibiting higher piezoelectric coupling coefficients, but it must be noted that no other material exists which affords low acoustic losses and which is currently able to be deposited reproducibly and uniformly, as described in the article: P. Muralt et al., Is there a better material for thin film BAW applications than AlN, Proceedings of the 2005 IEEE Ultrasonics Symposium.

Conversely, monocrystalline materials such as Lithium Niobate or Lithium Tantalate afford very high electromechanical coupling coefficients, allowing the production of filters exhibiting relative bandwidths of the order of 50%.

Thereafter, standards such as DCS also require both a wide passband and strong rejection of the adjacent standards. To simultaneously meet these two constraints requires the use of resonators possessing very large quality coefficients. Much work has been conducted in the last ten years to improve the acoustic wave confinement properties of resonators (J. Kaitila, Review of wave propagation in BAW thin film devices: progress and prospects, Proceedings of the 2007 IEEE Ultrasonics Symposium). Therefore, the limits imposed by the materials themselves, more than by the structure, are beginning to show up, and it is very probable that poly-crystalline materials will eventually no longer be able to cope with the rise in quality coefficients, especially faced with the rise in frequency of the standards toward 10 GHz. With intrinsic quality coefficients of the order of some ten thousand at frequencies above 1 GHz: D. Gachon et al., Filters using high overtone bulk acoustic resonators on thinned single-crystal piezoelectric layer, presented at the 2008 European Frequency and Time Forum, here again monocrystalline materials present themselves as an interesting solution.

Concerning resonators of FBAR type, Campanella et al. have produced an FBAR resonator, on the basis of a membrane of aluminum nitride (AlN) deposited on a platinum/ titanium metallic electrode. The substrate used, on which these layers rest, is made of silicon which has been etched by reactive plasma (RIE) to form a cavity. (H. Campanella, J. Esteve, E. Martincic, P. Nouet, A. Uranga, N. Barniol, IEEE SENSORS 2008).

The authors Pijolat et al. have shown the production of such resonators by transferring a thin film of $LiNbO_3$ onto silicon substrate by virtue of a process based on direct bonding and mechanical thinning (M. Pijolat, S. Loubriat, S. Queste, D. Mercier, A. Reinhardt, E. Defaÿ, C. Deguet, L. Clavelier, H. Moriceau, M. Aïd, and S. Ballandras, Appl. Phys. Lett 95 (2009) 182106).

Other authors have proposed to fabricate an FBAR structure with a suspended layer of $LiNbO_3$ and whose electrical characterizations at 200 MHz have been carried out: Y. Osugi, T. Yoshino, K. Suzuki and T. Hirai, IEEE 2007. Although the non-uniformity of the thickness over the wafer has a negative effect on the quality factor Q, the transferred layer of $LiNbO_3$ possesses a coupling factor $Kt^2$ close to that of the solid substrate.

Other types of resonators (including SAW resonators) are advantageously produced on suspended membranes.

Currently, two main techniques for transferring thin layers have already been proposed: a technique based on the implantation of light ions (typically hydrogen) and fracture at the level of the implanted zone, and the previously mentioned technique based on bonding and mechanical thinning. These techniques make it possible to transfer a monocrystalline layer onto a host substrate. These techniques are perfectly mastered on silicon allowing inter alia the industrial fabrication of SOI (Silicon On Insulator) dies.

The process of transfer by implantation/fracture is notably described in the article by M. Bruel: "Silicon on insulator material technology", Electronic letters, 31 (14), p 1201-1202 (1995), it allows the production of SOI "Silicon On Insulator" substrates.

Figure 2:
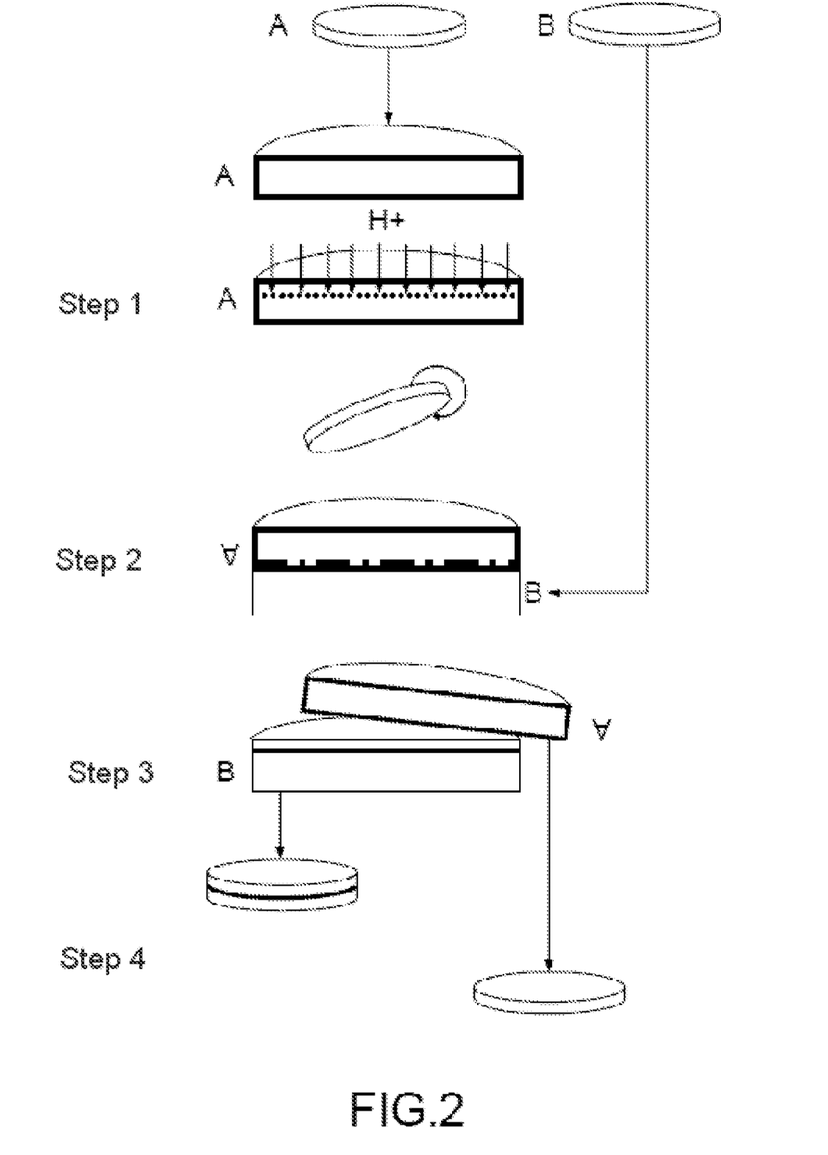
FIG. 2 illustrates the various steps of a process for transferring substrates by implantation/fracture according to the known art.

This process may be schematically summarized by the following four steps illustrated in FIG. 2:

Step 1: A donor substrate A, for example of silicon, is implanted with gaseous species (for example hydrogen and/or rare gases) to form a buried fragile zone, delimiting in this substrate the thin film to be transferred.

Step 2: The donor substrate is thereafter joined at the level of the previously defined thin film, for example by direct bonding (also called molecular bonding), with a receiving substrate B.

Step 3: A fracture step is thereafter obtained at the level of the buried fragile zone by means of a heat treatment optionally assisted by the application of mechanical stresses. One thus obtains on the one hand the thin film secured to the receiving substrate, and on the other hand the remnant of the donor substrate corresponding to the initial donor substrate A, peeled of the transferred thin film. The latter can then be recycled to carry out another transfer.

Step 4: Optionally, final treatments may be carried out, for example a high-temperature annealing to consolidate the bonding interface between the transferred thin film and the receiving substrate.

The thickness of the transferred thin film is directly related to the ion beam implantation energy. By way of example, the silicon thickness transferred can range from a few tens of nanometers to a few micrometers by using a conventional implanter (for which the implantation energy is typically less than 250 keV).

The transferred layers are uniform and homogeneous thickness-wise since they are defined by an implantation depth and not by mechanical thinning.

Document EP0741910 proposes to carry out a thin film transfer onto a substrate provided with cavities. The cavities are produced by photolithography and etching before the bonding step, which therefore adds an expensive step to the previously described process. Moreover, the achievable dimensions for the cavity are limited on account of the process.

Document EP0851465 proposes to locally debond a membrane from its support by implantation at the level of the bonding interface. In this case, the zone of strong implantation (around the bonding interface) undergoes significant damage that may cause local modification of the properties of the material.

Whereas today in the majority of components for MEMS "Micro-Electro-Mechanical Systems", the layers of piezoelectric materials are produced by deposition techniques of PVD "Plasma Vapor Deposition" type and the layers to be made for these components exhibit thicknesses in a range of thicknesses lying between a few hundred nanometers and a micrometer, mastery of the fabrication of monocrystalline piezoelectric and electrostrictive layers for this range of thicknesses constitutes a significant technological hurdle.

SUMMARY OF THE INVENTION

In this context, the subject of the present invention is an innovative process for fabricating a bulk acoustic wave resonator comprising a membrane comprising a slender layer of piezoelectric material.

More precisely the invention relates to a process for fabricating an acoustic wave resonator comprising a suspended membrane comprising a piezoelectric material layer, characterized in that it comprises the following steps:

the production of a first stack comprising at least one layer of first piezoelectric material on the surface of a first substrate;

the production of a second stack comprising at least one second substrate;

the production of at least one non-bonding initiating zone by deposition or creation of particles of controlled sizes leaving the surface of one of said stacks endowed locally with projecting nanostructures before a subsequent bonding step;

the direct bonding of said two stacks creating a blister between the stacks, due to the presence of the non-bonding initiating zone;

the thinning of the first stack to eliminate at least the first substrate.

The expression "direct bonding" is understood to mean any type of bonding not requiring the presence of an adhesive substance. It may advantageously involve bonding by direct contact but it may also involve bonding by thermocompression or anodic bonding or else fusion bonding.

The aim of the non-bonding initiating zone is thus to locally prevent bonding between the two stacks at the location thereof or in the vicinity thereof, thus generating a blister between the layer of first piezoelectric material and the second stack, allowing local acoustic decoupling of these two elements.

The nanostructures have lateral dimensions (in the plane of the substrate) of less than 1 micron and advantageously lying between 10 and 100 nm.

The invention thus makes it possible to produce suspended membranes collectively on a wafer with lateral dimensions ranging from 100 microns to a millimeter.

Advantageously, a heat treatment step may be carried out during or after the direct bonding step so as to promote the creation and/or the growth of the blister. Typically, this heat treatment can take place at a temperature lying between 100° C. and 500° C. This step can also allow two or more contiguous blisters to come together to form a blister of greater dimension.

The non-bonding initiating zone may be a projecting nanostructure, that is to say a local protuberance with respect to the surface of submicron dimensions. The blister generated then extends on either side of this nanostructure.

According to a variant of the invention, the step of producing this projecting nanostructure is performed by lithography and etching.

According to a variant of the invention, the step of producing this projecting nanostructure is performed by the deposition of particles of controlled size in a localized manner.

According to a variant of the invention, the projecting nanostructure exhibiting a height of the order of a few tens of nanometers to a few hundred nanometers, the blister exhibits a diametral extent of the order of a thousand micrometers.

It should be noted that the heat treatment carried out during or after the bonding step, can also make it possible to locally debond the surface of the projecting nanostructure from the surface of the stack facing it.

Likewise, the surface surrounding the projecting nanostructure or that facing the latter may have been prepared prior to the bonding so as to facilitate or to adapt the extension of the blister during the heat treatment for example.

This preparation can notably consist in decreasing the hydrophily and/or in increasing the roughness of the surface if it is desired to promote lateral extension of the blister and vice versa.

To modify the hydrophily, recourse may be had for example to a plasma or UV/ozone treatment. To modify the roughness, recourse may be had for example to a chemical, wet or dry etching.

According to a variant of the invention, the non-bonding initiating zone is obtained by the localized deposition of hydrocarbons or of liquid or solid products that may generate gaseous by-products, for example with the aid of an atomic force microscope (AFM) tip. This zone creates a non-bonding zone or blister which may be made to grow in dimension through the effect of pressure in the unbonded zone subsequent to heat treatment.

Advantageously, the first stack and/or the second stack can comprise at the surface a bonding layer, at the level of which the direct bonding is performed.

Advantageously, the first stack can comprise between the layer of first piezoelectric material and the optional bonding layer (or the surface) a metallic layer intended to serve as electrode.

Advantageously, the first piezoelectric material is monocrystalline. Such a layer may be obtained by epitaxy on a suitable substrate or constitute the superficial part of the first substrate. In this case, the first substrate may be a solid substrate of the first piezoelectric material. The layer can also be deposited on the first substrate.

According to a variant of the invention, the process furthermore comprises an ion implantation step so as to create in the first stack a buried fragile zone delimiting with the surface of said stack a zone comprising at least in part the layer of first piezoelectric material.

According to this variant of the invention, the thinning is then obtained by fracture at the level of the buried fragile zone.

According to another variant of the invention, the thinning is obtained by grinding and polishing.

Advantageously, the polishing step is a mechano-chemical polishing step (better known by the acronym CMP (chemical and mechanical polishing)). This polishing is carried out for example with the aid of a solution containing an abrasive (known as "slurry"), for example based on colloidal silica.

According to a variant of the invention, the piezoelectric material is $LiNbO_3$ or $LiTaO_3$ or more generally $Li(Ta_xNb_{1-x})O_3$. If the layer is deposited, the piezoelectric material may be AlN or PZT notably.

According to a variant of the invention, the second substrate is made of silicon or quartz or diamond or else sapphire. It may be simple or composite.

According to a variant of the invention, at least one bonding layer is made of dielectric material that may be $SiO_2$.

According to a variant of the invention, the process furthermore comprises a step of electrode definition in said metallic layer.

According to a variant of the invention, the process furthermore comprises a step of producing an upper electrode on the surface of the final stack of the first and second stacks after the thinning step.

BRIEF DESCRIPTION OF THE DRAWINGS

The invention will be better understood and other advantages will become apparent on reading the description which follows and by virtue of the appended figures among which.

DETAILED DESCRIPTION

Generally, the process of the present invention makes it possible to produce components based on acoustic waves, for example bulk acoustic wave components and notably components of FBAR resonator type comprising a suspended membrane of piezoelectric material with a lower electrode and an upper electrode so as to generate the propagation of bulk acoustic waves, said membrane being produced on the surface of a blister created on the basis of the joining by bonding of two supports, one comprising on its surface at least one non-bonding initiating zone, for example a projecting nanostructure.

The suspended material membrane comprises a slender piezoelectric material layer. The process for producing such a membrane can be based on a known and mastered process comprising the implantation of a solid substrate of piezoelectric material so as to create in this substrate a buried fragile zone delimiting in this substrate said slender layer and then the separation of said slender piezoelectric material layer from the piezoelectric substrate as a whole by fracture at the level of this fragile zone for example by heat treatment optionally assisted by mechanical forces.

Exemplary Embodiment

Figure 3A:
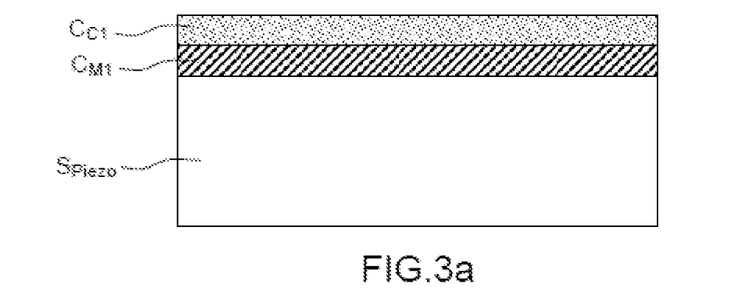
FIGS. 3a to 3e illustrate the various steps of an exemplary process for fabricating a resonator of FBAR type according to the invention.

A solid piezoelectric substrate $S_{Piezo}$ (for example of $LiNbO_3$, $LiTaO_3$ type, etc.), is chosen for the BAW application (in terms of orientation, of nature of material, etc.). As a variant, it could be a support substrate (of silicon for example) exhibiting only a superficial layer of piezoelectric material. It advantageously comprises a stack of at least one metallic layer $C_{M1}$ intended to be a buried electrode for the final resonator. This metallic layer may be based on Cu, AlCu, AlSi, W, Mo, Pt, Cr, etc.

The stack as a whole is thereafter optionally covered with a bonding layer $C_{C1}$; this may be for example a dielectric layer, for example of $SiO_2$ of a few hundred nm (for example 200 nm) at the surface intended to facilitate the subsequent direct bonding operation, as illustrated in FIG. 3a.

Figure 3B:
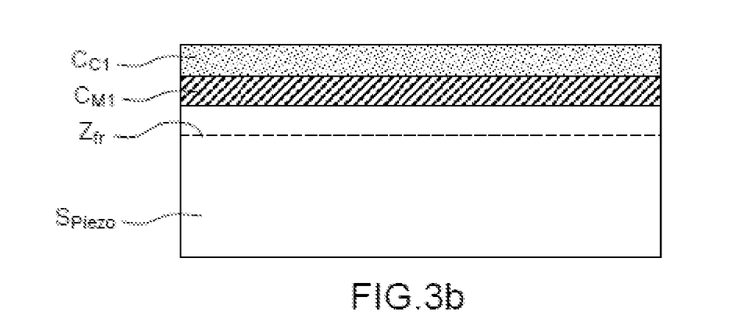

An ion implantation operation is carried out (before or after deposition of the metallic and bonding layers) in the piezoelectric solid substrate so as to create a buried fragile zone $Z_{fr}$ delimiting in this substrate the thin layer of piezoelectric material to be transferred. This implantation may be performed for example on the basis of hydrogen or helium or a mixture of these two species with doses between $10^{16}$ and $10^{17}$ at/cm$^2$, doing so with an energy of between 50 keV and 250 keV depending on the thickness of the piezoelectric layer chosen, as illustrated in FIG. 3b.

Figure 3C:
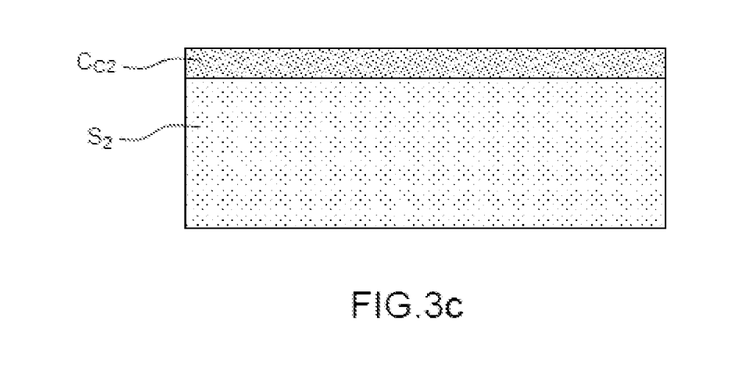

The deposition of a bonding layer, for example dielectric for example of $SiO_2$ at the surface intended for the bonding operation, is carried out in parallel on a second substrate $S_2$, as illustrated in FIG. 3c, which may be made of piezoelectric or nonpiezoelectric material, for example Si, Sapphire, Quartz, etc. It should be noted that this layer may be optional and dependent on the nature of said second substrate.

The substrates are thereafter prepared, for example by mechano-chemical polishing, so as to be compatible with the subsequent direct bonding step. This preparation can make it possible to obtain the planarity and the roughness desired for the subsequent direct bonding.

Figure 3D:
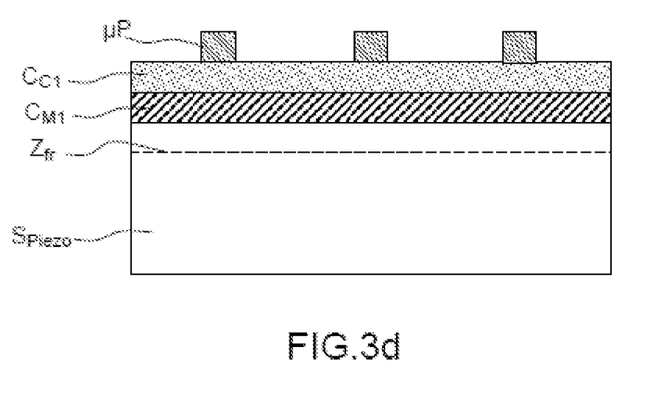

During/after this step, particles of controlled sizes are deposited/created on one of the two bonding interfaces. These particles or μ-pads can, for example, be created by lithography followed by etching or else by the deposition of particles of controlled size in a localized manner. FIG. 3d illustrates a configuration in which the μ-pads, μP, are produced on the surface of the layer $C_{C1}$. These particles are non-bonding initiating zones: locally they prevent the bonding of the two substrates at the level of these zones and/or around these zones. Other types of non-bonding initiating zones will be described subsequently.

Figure 3E:
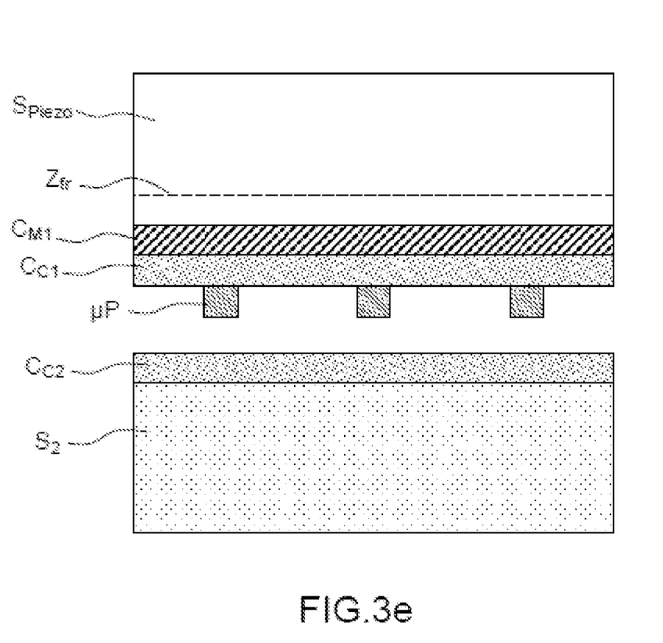

FIG. 3e illustrates the placing of the two stacks in contact before the bonding phase.

The two substrates are thereafter bonded by direct bonding as illustrated in the article: Tong & Gösele 1999, Q.-Y. Tong, U. Gösele, Semiconductor Wafer Bonding: Science and Technology, Wiley, New York, 1999, 297 pp. This article describes notably the behavior of a particle at the bonding interface: as a function of the size of the particle (in particular of its height), a blister of a specific radius and of height equal to that of the particle is formed.

Applied to the case of lithium niobate (in terms of deformation coefficient and surface energy corresponding to the material), the orders of magnitude of the radii of the blisters found by theoretical calculation and those found experimentally are in harmony.

In the case of the present invention, the applicant has observed that the height of the gas bubbles is markedly greater than the height of the particles: the diameter and the height of the blisters are controlled by the thermal budget applied.

According to the process of the present invention, a heat treatment is applied (between 100° C. and 500° C., preferably 250° C.) so as to initiate the transfer of the thin film of piezoelectric material by fracture at the level of the buried fragile zone. This heat treatment also makes it possible to grow the blister initially formed around the projecting nanostructure. On the particle-free zones and outside of the induced blister zones, the direct bonding of the faces is carried out.

Figure 4A:
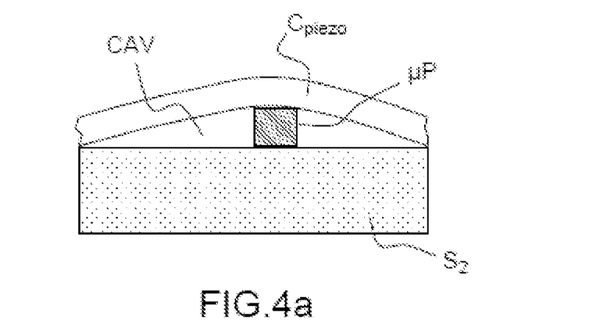
FIGS. 4a and 4b show diagrammatically the blister created during a step of the fabricating process according to the invention, before and after a heat treatment operation.
Figure 4B:
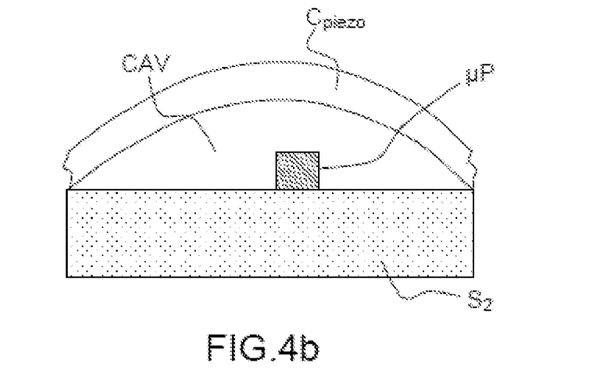

The application of an additional thermal budget (once fracture has been obtained) for example between 100 and 500° C. (preferably around 250° C.) makes it possible to control the lateral dimensions of blisters desired. It can also make it possible to debond the membrane from the projecting nanostructure (as illustrated in FIG. 4b);

This thermal budget can also allow two or more contiguous blisters to come together to form a blister of large dimension.

An additional encapsulation layer may be deposited to fasten the structure. FIGS. 4a and 4b thus show diagrammatically (only the piezoelectric material layer is represented) the formation of a blister CAV above a nanostructure μP, before and after heat treatment, leading to the extension of said blister.

Typically, for particles of the order of 100 nm in height, the maximum blister achieved is of the order of 1000 μm in diameter.

Finishing processes (such as heat treatment and/or polishing to obtain a roughness compatible with the production of components a posteriori) may be performed.

Figure 5:
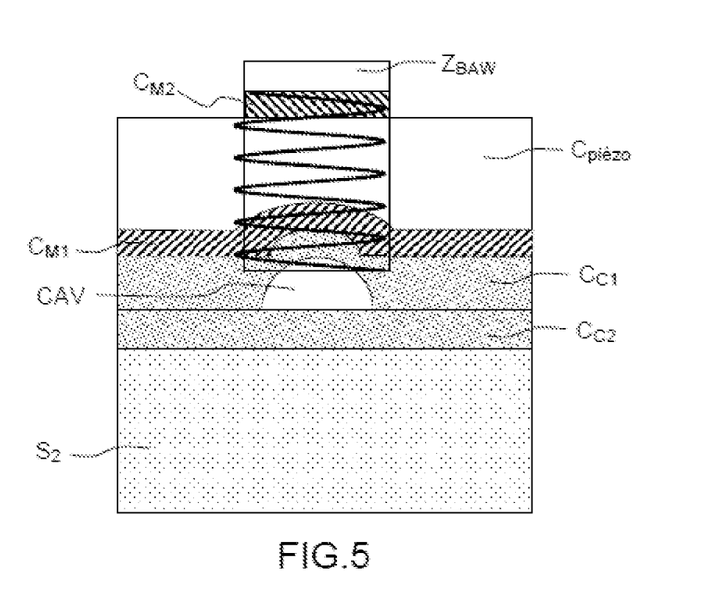
FIG. 5 illustrates a resonator of FBAR type produced according to the process of the invention.

A slender layer of piezoelectric material $C_{Piezo}$ is thus obtained, with additional layers on a host substrate. The final FBAR resonator is produced by deposition of an upper metallic electrode $C_{M2}$ at the level of the blister formed CAV, as illustrated in FIG. 5, moreover highlighting a zone $Z_{BAW}$ of propagation of bulk acoustic waves.

Figure 6:
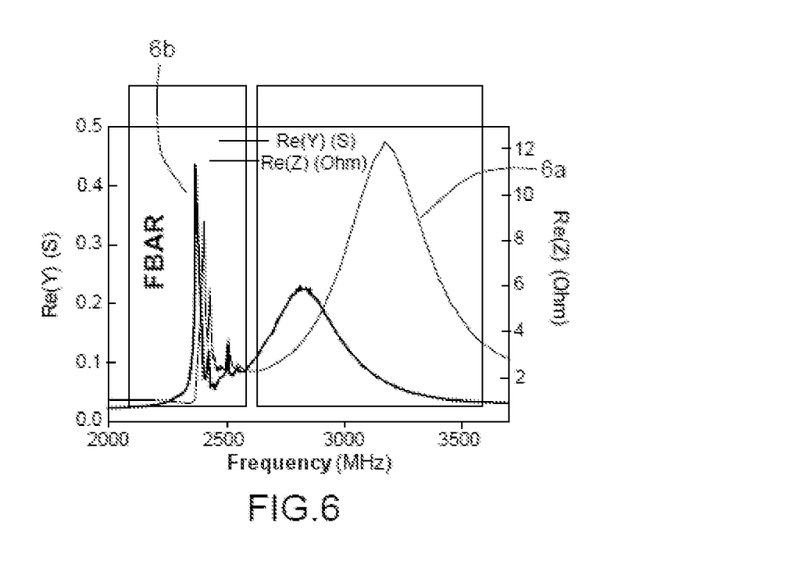
FIG. 6 illustrates the electrical response of the membrane not debonded from the substrate (curve 6a) and the response of the suspended membrane (curve 6b).

Electrical tests have been carried out on such a structure showing the resonant piezoelectric character of the suspended membrane. The curves of FIG. 6 illustrate the electrical response of the suspended membrane obtained according to the process of the invention. Curve 6a corresponds to the response of the piezoelectric layer not debonded from the substrate, curve 6b relating to said debonded membrane and therefore to the final structure of the FBAR resonator.

As mentioned previously, other types of non-bonding initiating zones may be produced on the surface of one or both substrates to be joined so as to locally preclude the direct bonding of these two substrates and thus to generate at the interface a blister acoustically decoupling these two substrates locally. This may involve notably hydrocarbon species present at the surface or liquid or solid species. These species may generate gaseous by-products. With a suitable heat treatment, this zone is made to grow in dimension through the effect of pressure in the unbonded zone, so as to generate a suspended membrane zone (held laterally). For the dimensioning effects, reference may be made to the articles by Tong and Goesele (book 1999 p. 42).

In the case of degassing, the article by F. Rieutord (ECS2010) gives for example the critical radius dimension Rc of bubbles (unbonded zones) as a function of pressure (to convey the number N of molecules or atoms available) at a given temperature. Rc is a value where the bubble is stable at a given temperature T.

During the heat treatment, the pressure increases like PV=NRT. The bonding energy may be increased during this heat treatment and yet it is not sufficient to prevent the opening of the zone, hence the increasing of the lateral dimensions r of the unbonded zone and of its height h.

Moreover, if r is greater than a critical radius such as defined in the article by F. Rieutord (ECS 2010) or Tong and Goesele (book 1999 p. 42), the unbonded zone is not resorbed.

These controlled contaminations make it possible to induce unbonded zones greater than a critical size.

In production, it is possible to deposit a contaminant that may degas on the surface of the bonding zone by AFM tip for example.

The invention claimed is:

1. A process for fabricating an acoustic wave resonator comprising a suspended membrane comprising a piezoelectric material layer, the process comprising:
    preparing a first stack comprising at least one layer of first piezoelectric material on a surface of a first substrate;
    preparing a second stack comprising at least one second substrate;
    depositing or creating particles of controlled sizes on a surface of one of said stacks;
    forming a projecting nanostructure on the surface of the one of said stacks before performing subsequent boding, where the projecting nanostructure comprises a non-bonding initiating zone comprising at least one particle of the particles of controlled sizes;
    forming a blister around the non-bonding initiating zone between said stacks during or after direct bonding said stacks; and
    thinning the first stack to eliminate at least the first substrate.

2. The process for fabricating an acoustic wave resonator as claimed in claim 1, further comprising:
    placing said two stacks in direct contact or by thermocompression or by anodic bonding or by fusion bonding.

3. The process for fabricating an acoustic wave resonator as claimed in claim 1, further comprising:
    carrying out a heat treatment during or after the direct bonding step so as to form or grow the blister.

4. The process for fabricating an acoustic wave resonator as claimed in claim 1, in which the non-bonding initiating zone is the projecting nanostructure corresponding to a local protuberance with respect to the surface of said stacks.

5. The process for fabricating an acoustic wave resonator as claimed in claim 4, further comprising: performing lithography and etching to form the projecting nanostructure.

6. The process for fabricating an acoustic wave resonator as claimed in claim 4, further comprising: depositing particles of controlled size in a localized manner on the surface of the one of said stacks to form the projecting nanostructure.

7. The process for fabricating an acoustic wave resonator as claimed in claim 4, further comprising: forming the blister greater than the particle in height, wherein the nanostructure has a lateral dimension in a range of from 10 to 100 nm.

8. The process for fabricating an acoustic wave resonator as claimed in claim 4, further comprising:
    preparing, prior to the bonding, a surface surrounding or facing the projecting nanostructure, so as to facilitate or to adapt an extension of the blister during heat treatment, and
    decreasing hydrophily and/or modifying a roughness of the surface.

9. The process for fabricating an acoustic wave resonator as claimed in claim 8, further comprising:
    carrying out a plasma or UV/ozone treatment to decrease the hydrophily.

10. The process for fabricating an acoustic wave resonator as claimed in claim 8, further comprising: carrying out chemical, wet or dry etching to modify the roughness.

11. The process for fabricating an acoustic wave resonator as claimed in claim 1, further comprising:
    carrying out localized deposition of hydrocarbons or of liquid or solid products that are able to generate gaseous by-products.

12. The process for fabricating an acoustic wave resonator as claimed in claim 11, further comprising:
    carrying out the localized deposition of hydrocarbons with an atomic force microscope tip.

13. The process for fabricating an acoustic wave resonator as claimed in claim 1, in which the first stack and/or the second stack comprise at the surface a bonding layer, at the level of which the subsequent bonding is performed.

14. The process for fabricating an acoustic wave resonator as claimed in claim 1, in which the first stack comprises between the layer of first piezoelectric material and an optional bonding layer or a surface, a metallic layer as electrode.

15. The process for fabricating an acoustic wave resonator as claimed in claim 1, in which the first piezoelectric material is monocrystalline.

16. The process for fabricating an acoustic wave resonator as claimed in claim 1, further comprising: carrying out ion implantation to form in the first stack a buried fragile zone delimiting with the surface of said stack a zone comprising at least in part the layer of first piezoelectric material.

17. The process for fabricating an acoustic wave resonator as claimed in claim 16, in which the thinning is obtained by fracture at the level of the buried fragile zone.

18. The process for fabricating an acoustic wave resonator as claimed in claim 1, in which the thinning is obtained by mechano-chemical polishing.

19. The process for fabricating an acoustic wave resonator as claimed in claim 1, in which the piezoelectric material is $Li(Ta_xNb_{1-x})O_3$.

20. The process for fabricating an acoustic wave resonator as claimed in claim 1, further comprising deposition of a piezoelectric material layer of AlN or PZT.

21. The process for fabricating an acoustic wave resonator as claimed in claim 1, in which the second substrate is made of silicon or quartz or diamond or sapphire, or of composite material comprising one of said materials.

22. The process for fabricating an acoustic wave resonator as claimed in claim 1, in which at least one bonding layer is made of dielectric material comprising $SiO_2$.

23. The process for fabricating an acoustic wave resonator as claimed in claim 1, further comprising a step of electrode definition in a metallic layer.

24. The process for fabricating an acoustic wave resonator as claimed in claim 1, further comprising a step of producing an upper electrode on the surface of the final stack of the first and second stacks, subsequent to the thinning step.

* * * * *